US008587079B2

(12) United States Patent
Cambou et al.

(10) Patent No.: US 8,587,079 B2
(45) Date of Patent: Nov. 19, 2013

(54) MEMORY ARRAY INCLUDING MAGNETIC RANDOM ACCESS MEMORY CELLS AND OBLIQUE FIELD LINES

(75) Inventors: Bertrand F. Cambou, Palo Alto, CA (US); Douglas J. Lee, San Jose, CA (US); Anthony J. Tether, Falls Church, VA (US); Barry Hoberman, Cupertino, CA (US)

(73) Assignee: Crocus Technology Inc., Santa Clara, CA (US)

( * ) Notice: Subject to any disclaimer, the term of this patent is extended or adjusted under 35 U.S.C. 154(b) by 0 days.

(21) Appl. No.: 13/572,566

(22) Filed: Aug. 10, 2012

(65) Prior Publication Data

US 2013/0037898 A1    Feb. 14, 2013

Related U.S. Application Data

(60) Provisional application No. 61/523,252, filed on Aug. 12, 2011.

(51) Int. Cl.
*H01L 27/22* (2006.01)

(52) U.S. Cl.
USPC .................................. 257/422; 257/E27.005

(58) Field of Classification Search
None
See application file for complete search history.

(56) References Cited

U.S. PATENT DOCUMENTS

| | | | |
|---|---|---|---|
| 6,391,483 B1 * | 5/2002 | Zhu et al. ...................... 428/810 |
| 7,102,918 B2 * | 9/2006 | Smith et al. ................... 365/158 |
| 7,190,611 B2 * | 3/2007 | Nguyen et al. ................ 365/158 |
| 2004/0001360 A1 | 1/2004 | Subramanian et al. | |
| 2004/0240265 A1 | 12/2004 | Lu et al. | |
| 2006/0039183 A1 | 2/2006 | Lin et al. | |
| 2006/0291276 A1 * | 12/2006 | Nozieres et al. .............. 365/158 |
| 2007/0091672 A1 | 4/2007 | Lin et al. | |
| 2009/0201720 A1 | 8/2009 | Lim | |

OTHER PUBLICATIONS

Zhu, J.G., Spin Valve and Dual Spin Valve Heads with Synthetic Antiferromagnets, IEEE Transactions on Magnetics, (35)2 1999 p. 655-60.*
Ju, K. and Allegranza, A., Multibit Cells Schemes for Toggle MRAM Applications, IEEE Transactions on Magnetics, 42(10), 2006, p. 2730-32.*
Sbiaa, R., R. Law, S. Y. H. Lua, E. L. Tan, T. Tahmasebi, C. C. Wang, and S. N. Piramanayagam. "Spin Transfer Torque Switching for Multi-bit per Cell Magnetic Memory with Perpendicular Anisotropy." Applied Physics Letters 99.9 (2011): 092506.*
International Search Report and Written Opinion, issued to international patent application No. PCT/US12/50554, Oct. 16, 2012, 8 pgs.

* cited by examiner

*Primary Examiner* — Thomas L Dickey
*Assistant Examiner* — Joseph Schoenholtz
(74) *Attorney, Agent, or Firm* — Cooley LLP

(57) ABSTRACT

A memory device includes a first plurality of magnetic random access memory (MRAM) cells positioned along a first direction, and a first bit line electrically connected to the first plurality of MRAM cells, the bit line oriented in the first direction. The device includes a first plurality of field lines oriented in a second direction different from the first direction, the first plurality of field lines being spaced such that only a corresponding first one of the first plurality of MRAM cells is configurable by each of the first plurality of field lines. The device includes a second plurality of field lines oriented in a third direction different from the first direction and the second direction, the second plurality of field lines being spaced such that only a corresponding second one of the first plurality of MRAM cells is configurable by each of the second plurality of field lines.

20 Claims, 4 Drawing Sheets

MEMORY ARRAY INCLUDING MAGNETIC RANDOM ACCESS MEMORY CELLS AND OBLIQUE FIELD LINES

CROSS-REFERENCE TO RELATED APPLICATION

The present application claims the benefit of U.S. Provisional Application No. 61/523,252, filed on Aug. 12, 2011, the disclosure of which is incorporated herein by reference in its entirety.

FIELD OF THE INVENTION

The invention relates generally to a memory array field line structure and, more particularly, to a memory array including magnetic random access memory cells and oblique field lines.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

In a conventional MRAM cell, a reference layer is typically exchange biased by an adjacent antiferromagnetic layer, which is characterized by a threshold temperature $T_{BR}$ of the antiferromagnetic layer. Below the threshold temperature $T_{BR}$, a magnetization of the reference layer is pinned by the exchange bias of the antiferromagnetic layer, thereby retaining the magnetization of the reference layer in a fixed direction. Above the threshold temperature $T_{BR}$, the exchange bias substantially vanishes, thereby unpinning the magnetization of the reference layer. Consequently, and in order to avoid data loss, an operation temperature window of the conventional MRAM cell has an upper bound defined by the threshold temperature $T_{BR}$.

In the case of a MRAM cell that is implemented for thermally assisted switching ("TAS"), a storage layer also is typically exchange biased by another antiferromagnetic layer, which is adjacent to the storage layer and is characterized by a threshold temperature $T_{BS}$ that is smaller than the threshold temperature $T_{BR}$. Below the threshold temperature $T_{BS}$, a magnetization of the storage layer is pinned by the exchange bias, thereby inhibiting writing of the storage layer. Writing is carried out by heating the MRAM cell above the threshold temperature $T_{BS}$ (but below $T_{BR}$), thereby unpinning the magnetization of the storage layer to allow writing, such as by applying a magnetic field. The MRAM cell is then cooled to below the threshold temperature $T_{BS}$ with the magnetic field applied, such that the magnetization of the storage layer is "frozen" in the written direction.

While offering a number of benefits, a conventional TAS-type MRAM device suffers from certain deficiencies. Specifically, a write operation temperature window is defined by $T_{BR}-T_{BS}$ and, therefore, is bounded by the threshold temperature $T_{BR}$ at the upper end and the threshold temperature $T_{BS}$ at the lower end. Because of practical constraints on antiferromagnetic materials for exchange bias, the write operation temperature window can be rather limited, such as to a range less than 200° C. or less than 150° C. Moreover, in the case of an array of TAS-type MRAM cells, characteristics of individual cells can vary across the array due to manufacturing variability. This variability can result in a distribution of the threshold temperatures $T_{BS}$ and $T_{BR}$ for the array, which, for example, can amount up to ±30° C., thereby further reducing the write operation temperature window. In addition, this variability can impact a resistance of magnetic tunnel junctions across the array and can result in a distribution of the resistance values $R_{min}$ and $R_{max}$ for the array, thereby complicating a comparison between a measured resistance value of an individual cell and a reference resistance value $R_{ref}$ during reading. Consequently, a tight tolerance control can be required during manufacturing, and this tight tolerance control can translate into lower manufacturing yields and higher manufacturing costs.

The limited operation temperature window of a conventional TAS-type MRAM device presents additional challenges. For example, in the case of certain applications, such as space, military, and automotive applications, an ambient temperature in the vicinity of the MRAM device can be rather high. A high local temperature also can result from current-induced heat transfer in the MRAM device itself or in an adjacent device. In order to pin a magnetization of a storage layer between write operations, the threshold temperature $T_{BS}$ can be set higher than the local temperature. However, a higher threshold temperature $T_{BS}$ has the undesirable effect of further reducing the operation temperature window of the MRAM device, thereby limiting its use for such high temperature applications.

Also, a high ambient temperature can result in a local temperature during writing that exceeds the threshold temperature $T_{BR}$, thereby unpinning a magnetization of a reference layer and yielding data loss. In order to avoid such data loss, a temperature controller can be included to compensate for local temperature variations. However, the inclusion of such temperature controller can add to the complexity of a MRAM device and can translate into higher manufacturing costs. Furthermore, and in the case of TAS, a speed of writing can depend upon a speed at which a cell within the MRAM device is heated. Specifically, a greater amount of power applied through the cell can translate into a faster speed of heating and, therefore, a faster speed of writing. However, in a conventional TAS-type MRAM cell, the speed of writing can be constrained, since the application of high power through the cell can result in a temperature overshoot above the threshold temperature $T_{BR}$, thereby yielding data loss.

It is against this background that a need arose to develop the MRAM devices and related methods described herein.

SUMMARY OF THE INVENTION

One aspect of the invention relates to a memory device. In one embodiment, the memory device includes a first plurality of magnetic random access memory (MRAM) cells positioned along a first direction, and a first bit line electrically connected to the first plurality of MRAM cells, the bit line oriented in the first direction. The memory device further includes a first plurality of field lines oriented in a second direction different from the first direction, the first plurality of field lines being spaced such that only a corresponding first one of the first plurality of MRAM cells is configurable by each of the first plurality of field lines. The memory device further includes a second plurality of field lines oriented in a third direction different from the first direction and the second direction, the second plurality of field lines being spaced such that only a corresponding second one of the first plurality of MRAM cells is configurable by each of the second plurality of field lines.

Another aspect of the invention relates to a memory array. In one embodiment, the memory array includes a plurality of columns of magnetic random access memory (MRAM) cells, each of the plurality of columns being oriented in a first direction and being electrically connected to a corresponding bit line oriented in the first direction. The memory array further includes a first plurality of field lines oriented in a second direction different from the first direction, and a second plurality of field lines oriented in a third direction different from the first direction and the second direction. Each of the MRAM cells is configurable by a corresponding one of the first plurality of field lines and a corresponding one of the second plurality of field lines, and each of the MRAM cells is magnetically isolated from each remaining one of the first plurality of field lines and each remaining one of the second plurality of field lines.

DETAILED DESCRIPTION

Definitions

Figure 1:
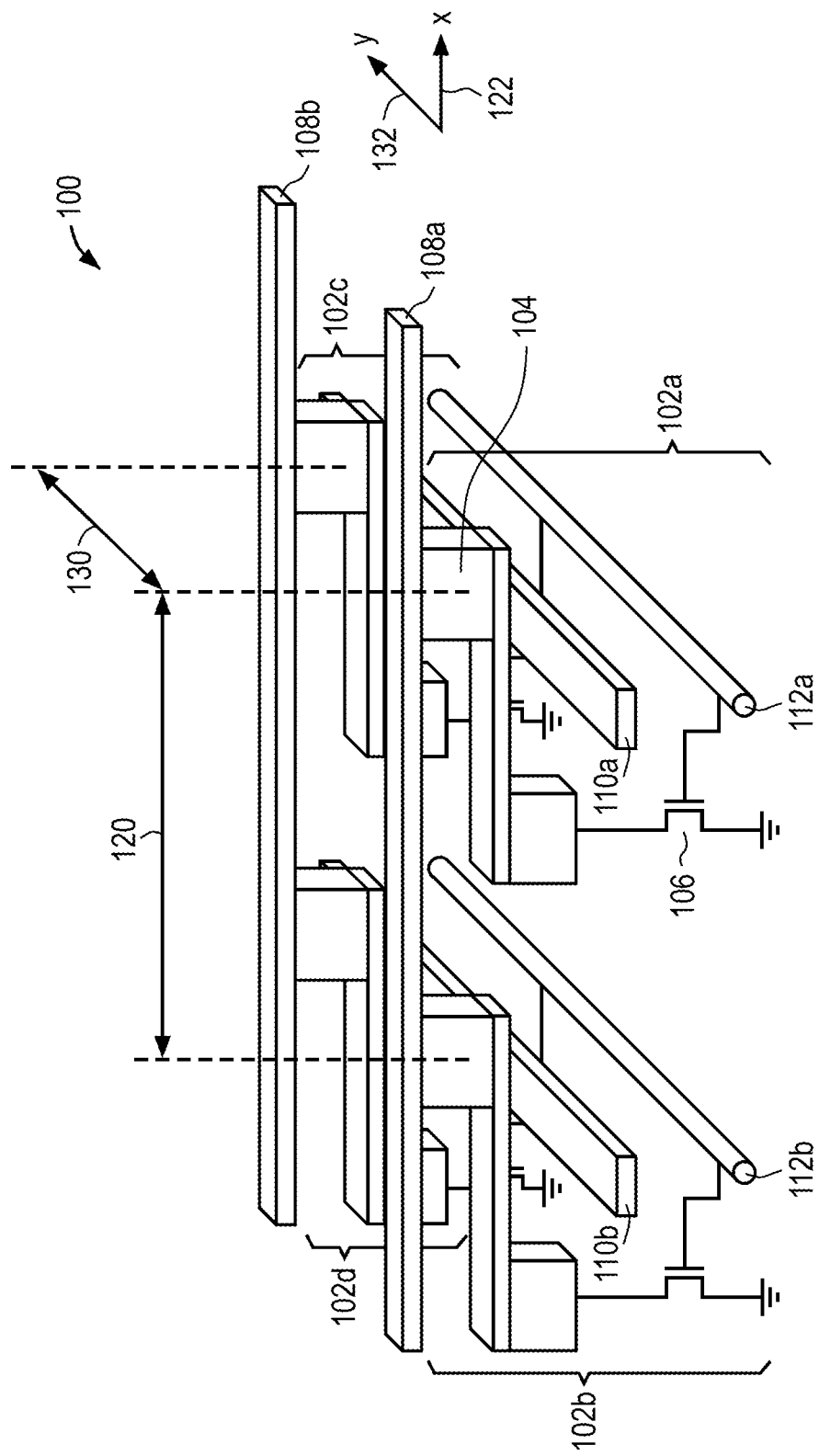
FIG. 1 is a perspective view of a memory device implemented in accordance with an embodiment of the invention.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining Adjacent objects can be spaced apart from one another or can be in actual or direct contact with one another. In some instances, adjacent objects can be formed integrally with one another.

As used herein, the terms "connect," "connected," and "connection" refer to an operational coupling or linking Connected objects can be directly coupled to one another or can be indirectly coupled to one another, such as via another set of objects.

DETAILED DESCRIPTION OF EMBODIMENTS OF THE INVENTION

Memory technologies can be used to store information in the form of patterns. The typical bit density of a memory array can be increased through use of multi-level storage cells and periphery logic systems designed for writing to and reading from the multi-level per cell memory array. The multi-level storage cells may store three or more states per cell. In the case of Magnetic Random Access Memories (MRAMs), multi-level-cell (MLC) configurations and systems, and in particular, the storage of multiple states per memory cell as a vector angle rather than as a bi-directional moment, have been described in CROC-002/00US, U.S. Ser. No. 13/023,442, the contents of which are incorporated herein by reference.

In non-volatile memories such as flash memories, interconnection of memories in series, such as in a NAND configuration, can increase physical bit density of a memory array because daisy-chaining of memory cells can eliminate shared physical elements such as a contact per memory cell, depending on the number of flash memories connected in series. A series-interconnected MRAM structure can utilize a similar daisy-chaining concept to increase the bit density of an MRAM array. A series-interconnected MRAM structure has been described in CROC-001/00US, U.S. Ser. No. 13/023,441, the contents of which are incorporated herein by reference. A series-interconnected MRAM structure has been described in CROC-011/00US, U.S. Ser. No. 61/493,890, the contents of which are incorporated herein by reference.

Furthermore, self-referencing of MRAM elements is described in CROC-002/00US, U.S. Ser. No. 13/023,442, the contents of which are incorporated herein by reference. With self-referencing, magnetic field lines biased by a current during a read operation can eliminate a costly manufacturing step (high temperature anneal under high magnetic field bias), and add logical functionality to the MRAM device. Additionally, self-referencing can add value to the reading of the MRAM cell by adding flexibility to the resultant field (e.g., varying the field from negative to positive to double the sensing signal), or largely eliminating the distribution effects due to process variations incurred as a statistical variation of the manufacturing process.

Embodiments of the invention relate to orienting field lines in an oblique fashion relative to MRAM cells in a chain or array of MRAM cells so that each individual MRAM cell in a chain or array of MRAM cells can be read without magnetically or electrically influencing the other MRAM cells in the chain or array being accessed. The MRAM cells may be self-referenced, and may be multi-bit (multi-level) cells each capable of storing data corresponding to one of at least three logic states. The MRAM cells in a chain (or in a row or column of the array) may also be series-interconnected. This architecture can result in a smaller physical memory with more tolerance to manufacturing process variation, lower manufacturing cost, an increase in bit density to allow higher density memory arrays, and other advantages that will be evident from the following description. Higher density MRAM-based memories can enable applications that have been previously addressed by multi-level flash memory. Advantageously, the combination of oblique field lines with multi-level, self-referenced MRAMs in series-interconnected chains can result in enabling many new applications because of the lowered cost structure, better immunity to process and manufacturing variance, and the benefits of the individual features described.

Attention first turns to FIG. 1, which is a perspective view of a memory device implemented in accordance with an embodiment of the invention. In the illustrated embodiment, the memory device is a MRAM device 100 that includes a set of MRAM cells 102a, 102b, 102c, and 102d. Each of the MRAM cells 102a, 102b, 102c, and 102d includes a magnetic tunnel junction and a selection transistor, such as a magnetic tunnel junction 104 and a selection transistor 106 included in the MRAM cell 102a. Referring to FIG. 1, the MRAM cells 102a, 102b, 102c, and 102d are arranged in rows and columns along substantially orthogonal directions of a square or rectangular array, although other two-dimensional and three-dimensional arrays are contemplated. Also, while the four MRAM cells 102a, 102b, 102c, and 102d are illustrated in FIG. 1, it is contemplated that more or less MRAM cells can be included in the MRAM device 100. It is also contemplated that a first number of MRAM cells per row may be the same as, or different from, a second number of MRAM cells per column.

In one embodiment, the rows and columns of the array may be substantially equally spaced, such that, for example, a spacing 120 of MRAM cells 102a and 102b in a first direction 122 is substantially equal to a spacing 130 of MRAM cells 102a and 102c in a second direction 132. In another embodiment, the rows of the array may be spaced by the spacing 120, and the columns of the array may be spaced by the spacing 130, where the spacing 120 is different from the spacing 130.

In the illustrated embodiment, the MRAM cells 102a, 102b, 102c, and 102d are implemented for self-referenced (SR) operations, in which a read operation can be carried out based on a relative alignment of magnetizations within a particular cell being read and without requiring a comparison to an external resistance value of a reference cell or a group of reference cells. As further explained below, the self-referenced implementation of the MRAM cells 102a, 102b, 102c, and 102d allows the omission of a reference layer with a fixed magnetization and, therefore, allows the operation of the MRAM cells 102a, 102b, 102c, and 102d in the absence of, or without regard to, the threshold temperature $T_{BR}$. In such manner, an operation temperature window of the MRAM device 100 can be greatly expanded, such as to allow operation under high ambient temperatures and to allow a faster speed of writing. Moreover, the MRAM device 100 can be afforded with a greater insensitivity to manufacturing variability, thereby increasing manufacturing yields and lowering manufacturing costs.

Referring to FIG. 1, the MRAM device 100 includes a set of traces or strip conductors to provide write and read functionality. In one embodiment, a set of field lines 110a and 110b extend across the array of the MRAM cells 102a, 102b, 102c, and 102d in a substantially parallel fashion with respect to one another. The set of field lines may be oriented substantially in the direction 132, with the field line 110a magnetically coupled to the MRAM cells 102a and 102c along one column of the array, and with the field line 110b magnetically coupled to the MRAM cells 102b and 102d along another column of the array. Alternatively, as described below with reference to FIG. 4, the field lines may be oriented in a direction different from the direction 132.

In one embodiment, during write operations, the application of currents through the field lines 110a and 110b induces magnetic fields that can vary one set of magnetizations of the MRAM cells 102a, 102b, 102c, and 102d, namely storage magnetizations of respective ones of the MRAM cells 102a, 102b, 102c, and 102d. During read operations, the application of currents through the field lines 110a and 110b induces magnetic fields that can vary another set of magnetizations of the MRAM cells 102a, 102b, 102c, and 102d, namely sense magnetizations of respective ones of the MRAM cells 102a, 102b, 102c, and 102d.

The MRAM device 100 also includes a set of bit lines 108a and 108b. The bit lines 108 extend across the array in a substantially parallel fashion with respect to one another (and in substantially the direction 122). In one embodiment, the bit lines 108a and 108b may extend across the array in a substantially orthogonal fashion with respect to the field lines 110a and 110b. Specifically, the bit line 108a is electrically coupled to the MRAM cells 102a and 102b along one row of the array, and the bit line 108b is electrically coupled to the MRAM cells 102c and 102d along another row of the array. In the illustrated embodiment, the MRAM cells 102a, 102b, 102c, and 102d are implemented for TAS, and, during write operations, the application of currents through the bit lines 108a and 108b and through the MRAM cells 102a, 102b, 102c, and 102d results in heating that allows the storage magnetizations of the MRAM cells 102a, 102b, 102c, and 102d to be varied. During read operations, the application of currents through the bit lines 108a and 108b and through the MRAM cells 102a, 102b, 102c, and 102d allows the determination of resistance values, which are indicative of a degree of alignment between the sense magnetizations and the storage magnetizations of the MRAM cells 102a, 102b, 102c, and 102d.

As illustrated in FIG. 1, the application of currents through the bit lines 108a and 108b also induces magnetic fields, which can vary the magnetizations of the MRAM cells 102a, 102b, 102c, and 102d during write and read operations. In other words, in one embodiment, the bit lines 108a and 108b can also function as a set of field lines. The implementation of such dual-function bit lines 108a and 108b conserves valuable die area and lowers manufacturing costs. Also, because of the close spacing of the bit lines 108a and 108b relative to the MRAM cells 102a, 102b, 102c, and 102d, switching efficiency of induced magnetic fields can be improved, thereby allowing low-intensity magnetic fields and reduced power consumption.

Still referring to FIG. 1, the MRAM device 100 further includes a set of control lines 112a and 112b, which are electrically coupled to the MRAM cells 102a, 102b, 102c, and 102d through their selection transistors. Specifically, the control line 112a is electrically coupled to the selection transistors of the MRAM cells 102a and 102c along one column of the array, and the control line 112b is electrically coupled to the selection transistors of the MRAM cells 102b and 102d along another column of the array. During write and read operations, the control lines 112a and 112b switch the selection transistors between a blocked mode (OFF) and a saturated mode (ON). Coordinated operation of the field lines 110a and 110b, the bit lines 108a and 108b, and the control lines 112a or 112b allows a particular subset of the MRAM cells 102a, 102b, 102c, and 102d to be selectively addressed during write and read operations. For example, when the MRAM cell 102a is to be written or read, the field line 110a and the bit line 108a can be activated, and the control line 112a also can be activated to switch the selection transistor 106 to a saturated mode, thereby inducing a magnetic field in the vicinity of the MRAM cell 102a and allowing the flow of a current through the MRAM cell 102a. In such manner, the MRAM cell 102a, which is disposed at an intersection of the field line 110a, the bit line 108a, and the control line 112a, can be individually addressed.

Other implementations of the field lines 110a and 110b, the bit lines 108a and 108b, and the control lines 112a or 112b are contemplated. Specifically, the orientation and the number of these traces can be varied from that illustrated in FIG. 1. For example, the field lines 110a and 110b can be combined into a common field line that is magnetically coupled to, and shared by, the MRAM cells 102a and 102c and the MRAM cells 102b and 102d in different columns. As another example, the field lines 110a and 110b can be disposed above the bit lines 108a and 108b, rather than below the bit lines 108a and 108b as illustrated in FIG. 1. As a further example, and as explained below with reference to FIG. 3, a set of field lines can be included above the bit lines 108a and 108b, in addition to the field lines 110a and 110b.

Figure 2:
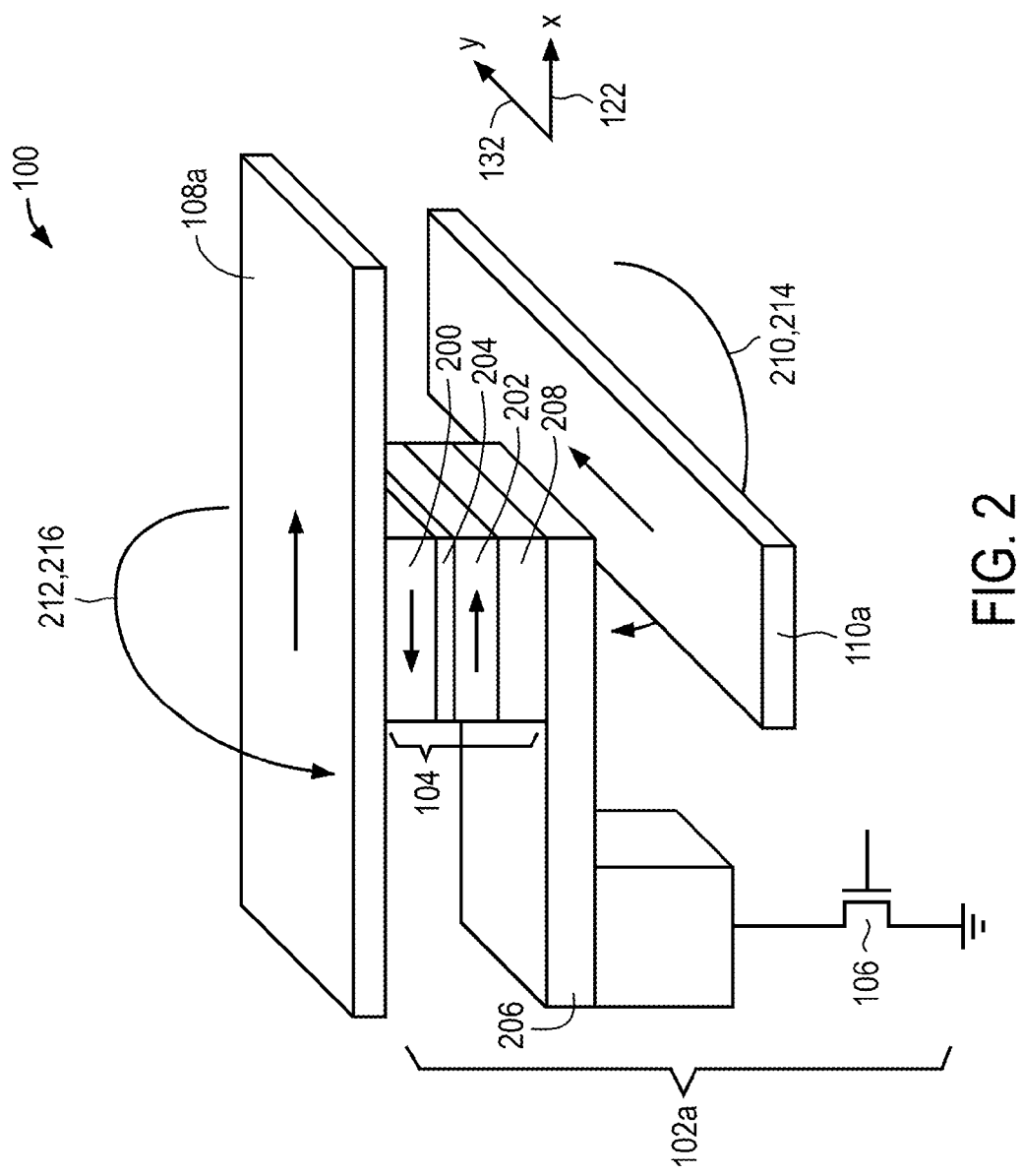
FIG. 2 is an enlarged view of an MRAM cell that is included in the memory device of FIG. 1, according to an embodiment of the invention.

Attention next turns to FIG. 2, which is an enlarged view of the MRAM cell 102a that is included in the MRAM device 100 of FIG. 1, according to an embodiment of the invention. The MRAM cell 102a includes the magnetic tunnel junction 104, which includes a sense layer 200, a storage layer 202, and a spacer layer 204 that is disposed between the sense layer 200 and the storage layer 202. As illustrated in FIG. 2, the bit line 108a is electrically coupled to the magnetic tunnel junction 104 on the side of the sense layer 200. In one embodiment, the bit line 108a is substantially orthogonal to the field line 110a, which is disposed below and magnetically coupled to the magnetic tunnel junction 104 on the side of the storage layer 202. The MRAM cell 102a also includes the selection transistor 106, which is electrically coupled, through a strap 206, to the magnetic tunnel junction 104 on the side of the storage layer 202. Other implementations of the MRAM cell 102a are contemplated. For example, the relative positioning of the sense layer 200 and the storage layer 202 can be reversed in the magnetic tunnel junction 104, with the storage layer 202 disposed above the sense layer 200.

Each of the sense layer 200 and the storage layer 202 includes, or is formed of, a magnetic material and, in particular, a magnetic material of the ferromagnetic type. The spacer layer 204 functions as a tunnel barrier and includes, or is formed of, an insulating material. Further description of the characteristics of the sense layer 200, the storage layer 202, and the spacer layer 204 is provided in CROC-002/00US, U.S. Ser. No. 13/023,442, the contents of which are incorporated herein by reference.

Referring to FIG. 2, the magnetic tunnel junction 104 also includes a pinning layer 208, which is disposed adjacent to the storage layer 202 and, through exchange bias, stabilizes the storage magnetization direction along a particular one of the m directions when a temperature within, or in the vicinity of, the pinning layer 208 is lower than a threshold temperature $T_{BS}$, such as a blocking temperature, a Neel temperature, or another threshold temperature. The pinning layer 208 unpins, or decouples, the storage magnetization direction when the temperature is above the threshold temperature $T_{BS}$, thereby allowing the storage magnetization direction to be switched to another one of the m directions. In contrast, such a pinning layer is omitted adjacent to the sense layer 200, and, as a result, the sense layer 200 has a sense magnetization direction that is unpinned and is readily varied, with the substantial absence of exchange bias. The pinning layer 208 includes, or is formed of, a magnetic material and, in particular, a magnetic material of the antiferromagnetic type. Further description of the characteristics of the pinning layer 208 is provided in CROC-002/00US, U.S. Ser. No. 13/023,442, the contents of which are incorporated herein by reference. Because the sense magnetization direction is unpinned, the threshold temperature $T_{BS}$ can be selected to accommodate a desired application, such as a high temperature application, in the absence of, or without regard to, a threshold temperature $T_{BR}$ that would otherwise set an upper bound of an operating temperature window.

During a TAS-type write operation of the MRAM cell 102a, the magnetic tunnel junction 104 is heated by applying a heating current through the magnetic tunnel junction 104 via the bit line 108a, with the selection transistor 106 in a saturated mode. The magnetic tunnel junction 104 is heated to a temperature above the threshold temperature $T_{BS}$ of the pinning layer 208, such that a magnetization of the storage layer 202 is unpinned. Simultaneously or after a short time delay, at least one of the field line 110a and the bit line 108a (functioning as another field line) is activated to induce a set of write magnetic fields to switch the storage magnetization direction from an initial one of m directions to another one of the m directions. Specifically, a write current can be applied through the field line 110a to induce a write magnetic field 210 to switch the storage magnetization direction accordingly. Alternatively, or in combination, a write current can be applied through the bit line 108a to induce a write magnetic field 212 to switch the storage magnetization direction accordingly.

In the illustrated embodiment, the MRAM cell 102a is implemented to store data corresponding to any of three or more logic states. In other words, the MRAM cell 102a is a multi-bit cell that stores a multi-bit data value. Other MRAM cells included in the MRAM device 100, such as the MRAM cells 102b, 102c, and 102d illustrated in FIG. 1, also can be implemented as multi-bit cells. The implementation of such multi-bit cells enhances a storage density of the MRAM device 100, relative to an implementation with single-bit or binary cells.

In accordance with the multi-bit implementation of the MRAM cell 102a, the storage layer 202 has a storage magnetization direction that is switchable between m directions corresponding to m logic states, with m>2. In one embodiment, by configuring the write currents applied through the field line 110a and the bit line 108a relative to each other, the storage magnetization direction can be switched between the m directions. In another embodiment, by configuring the write currents applied through the field line 110a and another field line 404 (see FIG. 3) relative to each other, the storage magnetization direction can be switched between the m directions. Further description of configuration of these write currents to switch the storage magnetization direction is provided in CROC-002/00US, U.S. Ser. No. 13/023,442, the contents of which are incorporated herein by reference.

Referring back to FIG. 2, once the storage magnetization direction is switched to a written direction, the selection transistor 106 is switched to a blocked mode to inhibit current flow through the magnetic tunnel junction 104, thereby cooling the magnetic tunnel junction 104. Either, or both, of the write magnetic fields 210 and 212 can be maintained during cooling of the magnetic tunnel junction 104, and can be deactivated once the magnetic tunnel junction 104 has cooled below the threshold temperature $T_{BS}$ of the pinning layer 208. Because the storage magnetization direction is pinned by the exchange bias of the pinning layer 208, its orientation remains stable so as to retain the written data.

Further description of other types of write operations, such as spin transfer torque ("STT") type write operations, is provided in CROC-002/00US, U.S. Ser. No. 13/023,442, the contents of which are incorporated herein by reference.

During a read operation of the MRAM cell 102a, at least one of the field line 110a and the bit line 108a (functioning as another field line) is activated to induce a set of read magnetic fields to vary a magnetization of the sense layer 200. Specifically, a read current can be applied through the field line 110a to induce a read magnetic field 214 to vary the sense magnetization direction accordingly. Alternatively, or in combination, a read current can be applied through the bit line 108a to induce a read magnetic field 216 to vary the sense magnetization direction accordingly. Because the sense layer 200 is subject to little or no exchange bias, the sense magnetization direction can be readily varied under low-intensity magnetic fields and at a temperature below the threshold temperature $T_{BS}$, while the storage magnetization direction remains stable in a written direction.

As part of each read cycle, a degree of alignment between the sense magnetization direction and the storage magnetization direction is determined by applying a sense current though the magnetic tunnel junction 104 via the bit line 108a, with the selection transistor 106 in a saturated mode. Measuring a resulting voltage across the magnetic tunnel junction 104 when the sense current is applied yields a resistance value of the magnetic tunnel junction 104 for a particular read cycle and for a particular applied sense magnetization direction. Alternatively, a resistance value can be determined by applying a voltage across the magnetic tunnel junction 104 and measuring a resulting current. When the respective magnetizations of the sense layer 200 and the storage layer 202 are antiparallel, a resistance value of the magnetic tunnel junction 104 typically corresponds to a maximum value, namely $R_{max}$, and, when the respective magnetizations are parallel, a resistance value of the magnetic tunnel junction 104 typically corresponds to a minimum value, namely $R_{min}$. When the respective magnetizations are between antiparallel and parallel, a resistance value of the magnetic tunnel junction 104 is typically between $R_{max}$ and $R_{min}$. Resistance values for multiple read cycles are processed to determine which value of the applied sense magnetization direction yielded a minimum resistance value, thereby yielding a stored multi-bit data value based on which of m logic states is assigned to the corresponding storage magnetization direction. Processing of the resistance values can be carried out using a suitable controller in combination with, for example, a sample/hold circuit.

The read operation of the MRAM cell 102a explained above is self-referenced, since it can be carried out based on the relative alignment of magnetizations within the MRAM cell 102a, without requiring a comparison to a reference cell or a group of reference cells. The self-referenced read implementation of the MRAM cell 102a is particularly desirable when reading multi-bit data, which otherwise would involve a comparison to multiple reference resistance values and would be prone to errors in view of manufacturing variability. The self-referenced implementation of the MRAM cell 102a also allows the omission of a reference layer with a fixed magnetization and, therefore, allows the operation of the MRAM cell 102a in the absence of, or without regard to, a threshold temperature $T_{BR}$. In such manner, an operation temperature window of the MRAM cell 102a can be greatly expanded, such as to temperatures up to about 400° C. or more. Moreover, and in view of the expanded operation temperature window, a high-intensity heating current can be applied during writing, such as in the form of a pulse having a duration of less than about 10 nanoseconds, thereby allowing a faster speed of writing.

Other implementations of self-referenced read operations are contemplated. For example, a faster speed of reading can be achieved by skipping certain of m logic states, with a resistance value corresponding to a skipped logic state determined by interpolation from adjacent logic states. A faster speed of reading also can be achieved by skipping certain of m logic states and using a suitable search technique to locate a minimum resistance value, such as by leveraging symmetries, incremental changes, or curvature related to resistance values of a subset of the m logic states.

In one embodiment, the MRAM cells 102 in each row of the array of FIG. 1 (such as MRAM cells 102a and 102b, or such as MRAM cells 102c and 102d) may be vertically or horizontally stacked. The MRAM cells 102 in each row of the array of FIG. 1 may also be series-interconnected in each stack. It is contemplated that each row of the array of FIG. 1 may include a stack or a series interconnection of more than two MRAM cells. Vertical stacking of the MRAM cells 102 allows multiple MRAM cells 102 to be arranged on top of one another, thereby achieving a higher density of the MRAM cells 102 for a given footprint area. Within a stack, the series interconnection of the MRAM cells 102 allows the flow of a common current through the MRAM cells 102 during write and read operations. During a TAS-type write operation, a common heating current can be applied through the stack of MRAM cells 102 to write multiple ones of the MRAM cells 102 in parallel, resulting in lower power consumption while retaining a desirable speed of writing. In addition, self-referenced implementation of the MRAM cells 102 and the provision of variable sense magnetizations allow an individual one of the MRAM cells 102 to be selected and probed, thereby facilitating read operations of the series-interconnected MRAM cells 102 while retaining the benefits of reduced power consumption.

In one embodiment including a chain of series-interconnected MRAM cells such as MRAM cells 102a and 102b, the field lines 110 run orthogonal to the direction 122 of the chain of series-interconnected MRAM cells. Sensing of a particular memory cell in the chain can be a two-step read, where the first read is with all field lines in the chain either floating or at a common bias (field), and the second read is the actual read of the selected cell with its field line biased differently than the remaining field lines. In one embodiment, the first read is with all field lines of the chain floating (i.e., unbiased or zero current flowing), and the second read is with the field line of the particular selected cell biased and the remaining field lines floating. Sensing is accomplished by first sampling the resultant resistance of the chain in the first read and comparing the actual resistance in the second read to the sampled resistance from the first read. The unselected cells can see the same bias of their field lines for both reads to allow the contribution of each unselected cell to the total resistance to be a common mode signal to the sensing circuit. Their manufacturing process variations can therefore be nulled from the sensing circuit. It is also contemplated that the "floating" field lines could be biased in other ways.

Further description of vertical and horizontal stacking of MRAM cells is provided in CROC-001/00US, U.S. Ser. No. 13/023,441, the contents of which are incorporated herein by reference. Further description of the characteristics and operation of series-interconnected MRAM cells is provided in CROC-001/00US, U.S. Ser. No. 13/023,441, the contents of which are incorporated herein by reference, and CROC-011/00US, U.S. Ser No. 61/493,890, the contents of which are incorporated herein by reference.

Figure 3:
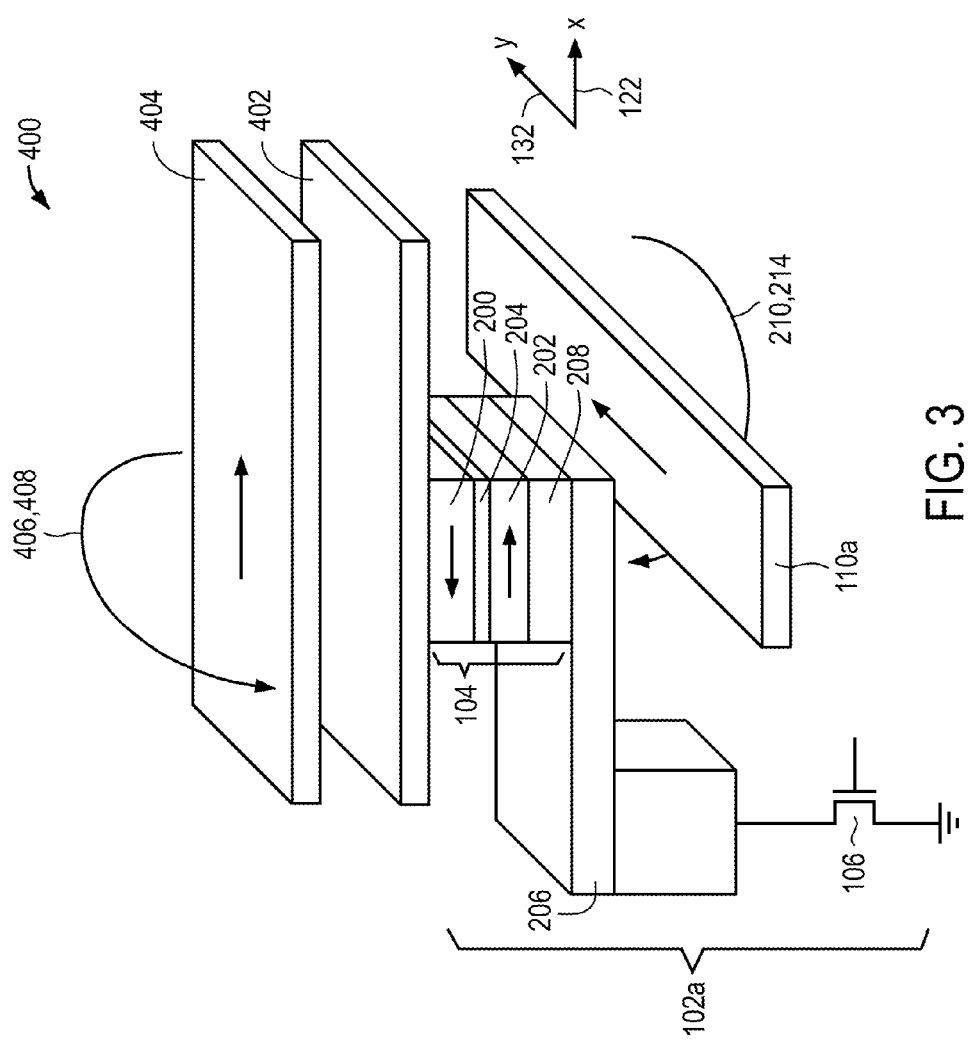
FIG. 3 illustrates an MRAM device implemented in accordance with another embodiment of the invention.

FIG. 3 illustrates a MRAM device 400 implemented in accordance with another embodiment of the invention. Certain aspects of the MRAM device 400 are implemented in a similar fashion as the MRAM device 100 explained with reference to FIG. 1 through FIG. 2, and those aspects are not repeated below. Referring to FIG. 3, the MRAM device 400 includes a bit line 402, which is electrically coupled to the magnetic tunnel junction 104 and is dedicated for applying a heating current during writing and applying a sense current during reading. In addition to the field line 110a, the MRAM device 400 includes another field line 404, which is disposed above the bit line 402. In one embodiment, the field line 404 is substantially orthogonal to the field line 110a. During a write operation, a write current can be applied through the field line 404 to induce a write magnetic field 406 to switch a storage magnetization direction accordingly. During a read operation, a read current can be applied through the field line 404 to induce a read magnetic field 408 to vary a sense magnetization direction accordingly. The field line 404 can be activated in combination with the field line 110a to induce a resultant magnetic field during writing and reading.

In one embodiment, the field lines 110a and 404 are used for both write and read. During a write, after the TAS heating, the vector sum of these two orthogonally biased field lines creates the angle to set the magnetic moment of the MRAM cell 102. After cooling, the stored moment is "pinned" at that angle because of the interaction of its neighboring antiferromagnetic layer. During a read, the field lines can be biased with various values to measure the resultant resistance corresponding to the stored moment. A minimum or maximum resistance can be achieved depending on if the combined fields form the vector used to create the stored moment (parallel) or exactly opposite to that angle (anti-parallel). In either case, the angle of the stored moment can be sensed and thus discriminated as the stored state of the memory cell. Four different angles (e.g., 0 degrees, 90 degrees, 180 degrees, 270 degrees) can be used for a 2 bit cell, 8 different angles for a 3 bit cell, and so on.

In one embodiment, the field lines 110a and 404 can be made to sweep in value and the resultant resistance can be monitored in real time to detect the minimum or maximum and simultaneously latch the "angle" of the vector sum of the field lines. An analog-to-digital (ATD) conversion circuit could then be used to convert that angle to the digital equivalent of the stored data. In this embodiment, the sensing circuit can be a sample and hold real time differentiator/ATD circuit.

In one embodiment, the field lines 110a and 404 are used for both write and read as described above with reference to FIG. 3, and multiple MRAM cells 102 are series-interconnected in a chain as described above with reference to FIG. 1. For a write, since TAS heating is employed, one of the field lines may run parallel to the chain, while the other field line can be orthogonal to the chain. Conversely, for a read, if one of the field lines runs parallel to the chain and is used to bias a selected MRAM cell 102a in the chain, other unselected MRAM cells 102 in the chain will typically be biased as well such that the resultant resistance of the chain is affected by changes in the resistance of both the selected MRAM cell 102a and the other unselected MRAM cells 102. As described above, the first step can float all of the field lines associated with a particular chain, but it can be desirable that the second step bias the single selected MRAM cell 102a in the chain without affecting the values of the resistances of the other unselected MRAM cells 102 in the chain. A mechanism for achieving this is described below with reference to FIG. 4.

Figure 4:
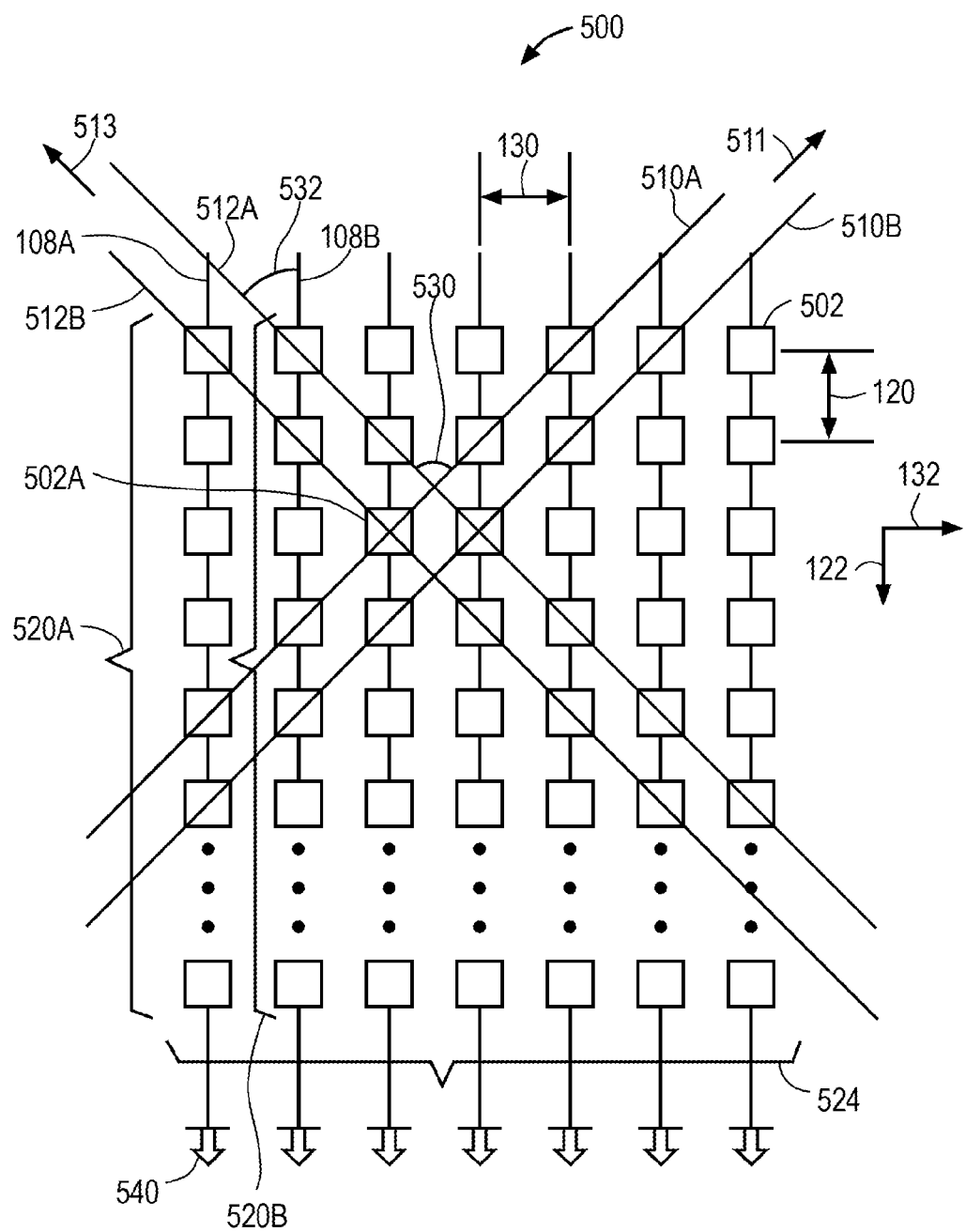
FIG. 4 is a top view of a memory device implemented in accordance with an embodiment of the invention.

FIG. 4 illustrates a top view of a memory device implemented in accordance with an embodiment of the invention. In the illustrated embodiment, the memory device is a MRAM device 500 that includes an array of MRAM cells 502. In one embodiment, the MRAM cells 502 have similar characteristics to those of MRAM cells 102 (see description related to FIG. 1). Referring to FIG. 4, the MRAM cells 502 are arranged in rows and columns along substantially orthogonal directions of a square or rectangular array, although other two-dimensional and three-dimensional arrays are contemplated. Also, it is contemplated that more or less MRAM cells 502 can be included in the MRAM device 500 than are illustrated in FIG. 4. It is also contemplated that a first number of MRAM cells per row 524 may be the same as, or different from, a second number of MRAM cells per column 520.

The rows 524 and columns 520 of the array may be substantially equally spaced, such that, for example, the spacing 120 in the first direction 122 of MRAM cells 502 in adjacent rows 524 is substantially equal to the spacing 130 of MRAM cells 502 in adjacent columns 520 in the second direction 132. Alternatively, the spacing 120 may be different from the spacing 130.

In one embodiment, each column of MRAM cells 502 may be connected by a single bit line. For example, a first column 520A of MRAM cells 502 may be connected by a bit line 108A, and a second column 520B of MRAM cells 502 may be connected by a bit line 108B. The bit lines 108 may also be connected to ground 540. Each column of MRAM cells 502 may be vertically or horizontally stacked, as described previously with reference to FIG. 1. Each column of MRAM cells may be a series-interconnected chain of MRAM cells, as described previously with reference to FIGS. 1 and 3. Each column of MRAM cells 502 may be self-referenced, as described previously with reference to FIGS. 1-3. In addition, one or more of the MRAM cells 502 may be multi-bit (multilevel) cells, as described with reference to FIGS. 2 and 3.

In the embodiment illustrated in FIG. 4, both field lines 510 and 512 are oblique or off-axis to the direction 122 of series interconnected chains 520 of MRAM cells 502. The field lines 510 are oriented in a direction 511 different from the directions 122 and 132, and are spaced such that only a corresponding first one of each chain 520 of MRAM cells 502 is configurable by each of the field lines 510. In addition, the field lines 512 are oriented in a direction 513 different from the directions 122 and 132, and are spaced such that only a corresponding second one of each chain 520 of MRAM cells 502 is configurable by each of the field lines 512. In one embodiment, each of the field lines 510 is magnetically isolated from each chain 520 of MRAM cells 502 except for the corresponding first one of the MRAM cells 502 in each chain 520. Similarly, each of the field lines 512 is magnetically isolated from each chain 520 of MRAM cells 502 except for the corresponding second one of the MRAM cells 502 in each chain 520. In this way, the field lines 510 and 512 are oriented and spaced such that a single selected MRAM cell 502 in each chain 520 can be read without affecting the values of the resistances of the other unselected MRAM cells 502 in the chain 520.

For example, in one embodiment, field lines 510A and 512B are oriented such that the combination of the field lines 510A and 512B can configure only MRAM cell 502A. Similarly, each pair of field lines, one selected from the field lines 510 and the other selected from the field lines 512, can configure a single, distinct one of the MRAM cells 502.

In one embodiment, the direction 511 of the field lines 510 is substantially orthogonal to the direction 513 of the field lines 512. Alternatively, the direction 511 of the field lines 510 may be non-orthogonal to the direction 513 of the field lines 512. For example, if the spacing 120 is not equal to the spacing 130, the direction 511 may be non-orthogonal to the direction 513. An angle 530 between the direction 511 and the direction 513 may be in the range from 5 degrees to 85 degrees, such as 5 degrees, 5.5 degrees, and so on up to 85 degrees, or may be in the range from 95 degrees to 175 degrees, such as 95 degrees, 95.5 degrees, and so on up to 175 degrees. It is also contemplated that the angle 530 may assume other suitable values that allow a single selected MRAM cell 502 in a chain 520 to be read without affecting the values of the resistances of the other unselected MRAM cells 502 in the chain 520.

In one embodiment, the direction 511 of the field lines 510 is substantially orthogonal to the direction 513 of the field lines 512, and an angle 532 between the direction 513 and the chains 520 is substantially equal to 45 degrees. This configuration may maximize the power efficiency of configuring stored and sense magnetizations of any MRAM cells 502 that are multi-bit cells with the field lines 510 and 512. It is contemplated that there may be other reasons to configure the field lines 510 and 512 such that the angle 532, for example, is a value different from 45 degrees and such that the angle 530 is different from 90 degrees. For example, spacing 130 may be different from spacing 120. In another example, it may be desirable to orient the field lines 510 and 512 differently when interconnecting MRAM cells of different types, such as self-referenced multi-bit stacked MRAM cells and self-referenced multi-bit unstacked MRAM cells. A vector sum corresponding to a desired storage or sense magnetization can be achieved for virtually any angles 530 and 532 given sufficient strength of the bias currents in each of the field lines.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A memory device comprising:
   a first plurality of magnetic random access memory (MRAM) cells positioned along a first direction;
   a first bit line electrically connected to the first plurality of MRAM cells, the first bit line oriented in the first direction;
   a first plurality of field lines oriented in a second direction different from the first direction, the first plurality of field lines being spaced such that only a corresponding first one of the first plurality of MRAM cells is configurable by each of the first plurality of field lines; and
   a second plurality of field lines oriented in a third direction different from the first direction and the second direction, the second plurality of field lines being spaced such that only a corresponding second one of the first plurality of MRAM cells is configurable by each of the second plurality of field lines;
   wherein in a first mode, a magnetization direction associated with each of the first plurality of MRAM cells is settable by either of a first current flowing through one of the first plurality of field lines or a second current flowing through one of the second plurality of field lines; and
   wherein in a second mode, the magnetization direction associated with each of the first plurality of MRAM cells is settable by both the first current and the second current applied concurrently.

2. The memory device of claim 1, wherein the second direction is orthogonal to the third direction.

3. The memory device of claim 1, wherein:
   each of the first plurality of field lines is magnetically isolated from the first plurality of MRAM cells except for the corresponding first one of the first plurality of MRAM cells; and
   each of the second plurality of field lines is magnetically isolated from the first plurality of MRAM cells except for the corresponding second one of the first plurality of MRAM cells.

4. The memory device of claim 1, further comprising:
   a second plurality of magnetic random access memory (MRAM) cells positioned along the first direction, wherein the second plurality of MRAM cells is spaced apart from the first plurality of MRAM cells in a fourth direction orthogonal to the first direction; and
   a second bit line electrically connected to the first plurality of MRAM cells, the second bit line oriented in the first direction;
   wherein the first plurality of field lines is spaced such that only a corresponding first one of the second plurality of MRAM cells is configurable by each of the first plurality of field lines; and
   wherein the second plurality of field lines is spaced such that only a corresponding second one of the second plurality of MRAM cells is configurable by each of the second plurality of field lines.

5. The memory device of claim 1, wherein a first one of the first plurality of MRAM cells includes a first storage layer having a magnetization direction that is switchable to store data corresponding to one of at least three logic states.

6. The memory device of claim 5, wherein a second one of the first plurality of MRAM cells includes a second storage layer having a magnetization direction that is switchable to store data corresponding to one of two logic states.

7. The memory device of claim 1, wherein the first plurality of MRAM cells are connected in series to produce a combined output.

8. The memory device of claim 1, wherein at least one of the first plurality of MRAM cells is self-referenced.

9. The memory device of claim 1, wherein an angle between the second direction and the third direction is in the range from 5 degrees to 85 degrees.

10. The memory device of claim 1, wherein the first plurality of MRAM cells includes at least one multi-bit stacked MRAM cell and at least one multi-bit unstacked MRAM cell.

11. A memory array comprising:
    a plurality of columns of magnetic random access memory (MRAM) cells, each of the plurality of columns being oriented in a first direction and being electrically connected to a corresponding bit line oriented in the first direction;

a first plurality of field lines oriented in a second direction different from the first direction; and a second plurality of field lines oriented in a third direction different from the first direction and the second direction;

wherein each of the MRAM cells is configurable by a corresponding one of the first plurality of field lines and a corresponding one of the second plurality of field lines, and each of the MRAM cells is magnetically isolated from each remaining one of the first plurality of field lines and each remaining one of the second plurality of field lines;

wherein in a first mode, a magnetization direction associated with each of the MRAM cells is settable by either of a first current flowing through one of the first plurality of field lines or a second current flowing through one of the second plurality of field lines; and wherein in a second mode, the magnetization direction associated with each of the MRAM cells is settable by both the first current and the second current applied concurrently.

12. The memory array of claim 11, wherein the second direction is orthogonal to the third direction.

13. The memory array of claim 11, wherein an angle between the second direction and the third direction is in the range from 5 degrees to 85 degrees.

14. The memory array of claim 11, wherein a first MRAM cell included in the plurality of columns of MRAM cells includes a first storage layer having a magnetization direction that is switchable to store data corresponding to one of at least three logic states.

15. The memory array of claim 11, wherein a second MRAM cell included in the plurality of columns of MRAM cells includes a second storage layer having a magnetization direction that is switchable to store data corresponding to one of two logic states.

16. The memory array of claim 11, wherein at least one of the plurality of columns of MRAM cells are connected in series to produce a combined output.

17. The memory array of claim 11, wherein at least one MRAM cell included in the plurality of columns of MRAM cells is self-referenced.

18. The memory array of claim 11, wherein the first plurality of field lines and the second plurality of field lines are oriented and spaced such that a single selected MRAM cell included in each of the plurality of columns of MRAM cells is readable without affecting values of the resistances of each remaining unselected MRAM cell in the each of the plurality of columns of MRAM cells.

19. The memory array of claim 11, wherein at least one multi-bit stacked MRAM cell and at least one multi-bit unstacked MRAM cell are included in the plurality of columns of MRAM cells.

20. The memory array of claim 11, wherein the first plurality of field lines and the second plurality of field lines are oriented at an angle of 45 degrees relative to the plurality of columns of MRAM cells, such that power efficiency of configuring stored and sense magnetizations of the MRAM cells is maximized.

* * * * *